(12) United States Patent  (10) Patent No.: US 8,877,340 B2
Chu et al.  (45) Date of Patent: Nov. 4, 2014

(54) GRAPHENE GROWTH ON A NON-HEXAGONAL LATTICE

(75) Inventors: Jack O. Chu, Manhasset Hills, NY (US); Christos Dimitrakopoulos, Baldwin Place, NY (US); Marcus O. Freitag, Sleepy Hollow, NY (US); Alfred Grill, White Plains, NY (US); Timothy J. McArdle, Mahopac, NY (US); Chun-Yung Sung, Poughkeepsie, NY (US); Robert L. Wisnieff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 241 days.

(21) Appl. No.: 12/844,029

(22) Filed: Jul. 27, 2010

(65) Prior Publication Data

US 2012/0028052 A1  Feb. 2, 2012

(51) Int. Cl.
*B32B 9/00* (2006.01)

(52) U.S. Cl.
USPC ........................................... 428/408; 423/448

(58) Field of Classification Search
USPC .................... 428/408; 423/447.1; 977/742
See application file for complete search history.

(56) References Cited

U.S. PATENT DOCUMENTS

| 5,200,022 A | 4/1993 | Kong et al. | |
|---|---|---|---|
| 2009/0020764 A1* | 1/2009 | Anderson et al. | 257/77 |
| 2009/0047520 A1* | 2/2009 | Lee et al. | 428/408 |
| 2009/0079040 A1* | 3/2009 | Schultz et al. | 257/632 |
| 2010/0021708 A1* | 1/2010 | Kong et al. | 428/220 |

OTHER PUBLICATIONS

Thermal Stress in heteroepitaxial Beta Silicon Carbide This Films Grown on Silicon Substrates, Liaw, J. Electrochem. Soc.; Solid State Science and Technology, Dec. 1984.*
Thermodynamic and Kinetics of Graphene on SiC (0001), Tromp PRL 102, 106104 Mar. 2009.*
Office Action dated Dec. 20, 2012, received in a related U.S. Patent Application, namely U.S. Appl. No. 13/596,152.

* cited by examiner

*Primary Examiner* — Daniel H Miller
(74) *Attorney, Agent, or Firm* — Scully, Scott, Murphy & Presser, P.C.; Louis J. Percello, Esq.

(57) ABSTRACT

A graphene layer is formed on a crystallographic surface having a non-hexagonal symmetry. The crystallographic surface can be a surface of a single crystalline semiconductor carbide layer. The non-hexagonal symmetry surface of the single crystalline semiconductor carbide layer is annealed at an elevated temperature in ultra-high vacuum environment to form the graphene layer. During the anneal, the semiconductor atoms on the non-hexagonal surface of the single crystalline semiconductor carbide layer are evaporated selective to the carbon atoms. As the semiconductor atoms are selectively removed, the carbon concentration on the surface of the semiconductor-carbon alloy layer increases. Despite the non-hexagonal symmetry of the surface of the semiconductor-carbon alloy layer, the remaining carbon atoms can coalesce to form a graphene layer having hexagonal symmetry.

14 Claims, 9 Drawing Sheets

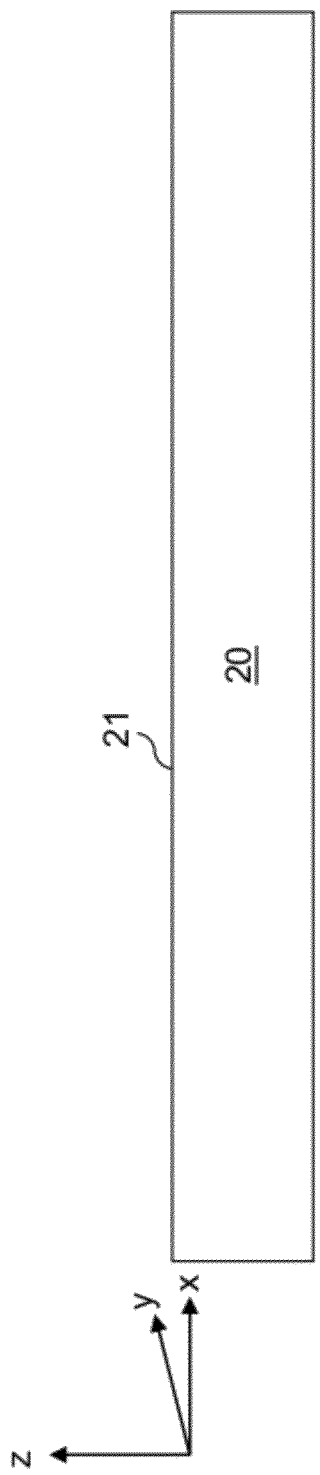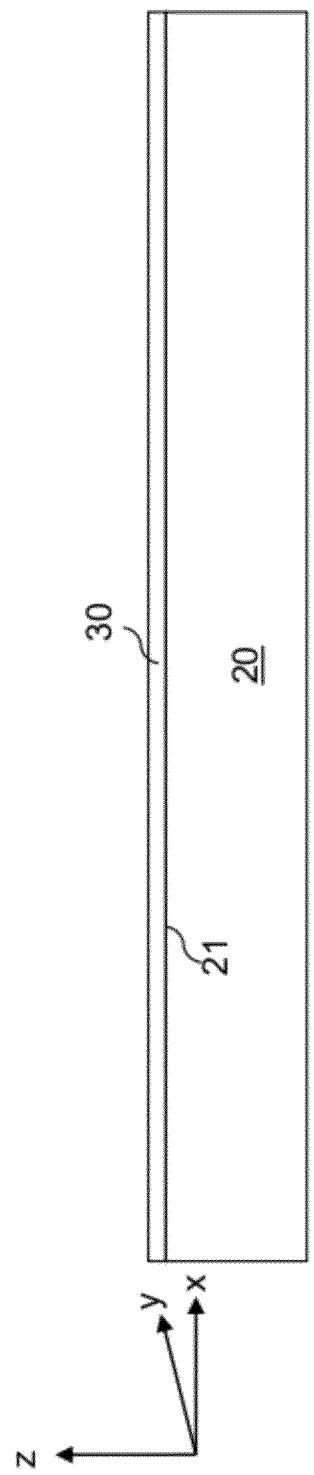

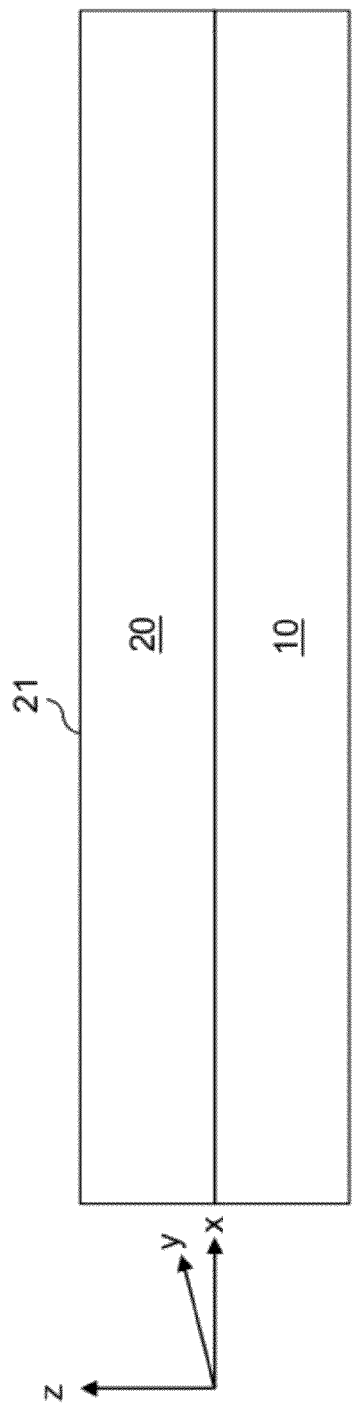
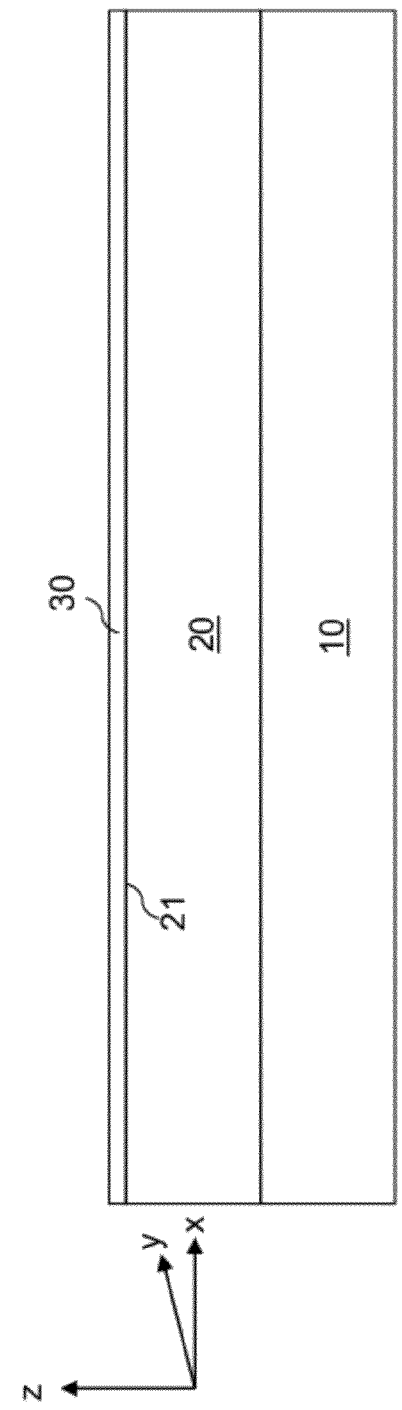
FIG. 4
FIG. 5

GRAPHENE GROWTH ON A NON-HEXAGONAL LATTICE

STATEMENT REGARDING FEDERALLY SPONSORED RESEARCH OR DEVELOPMENT

This invention was made with government support under Defense Advanced Research Project Agency (DARPA) CERA Contract No. FA8650-08-C-7838 awarded by the U.S. Department of Defense. The government has certain rights in this invention.

BACKGROUND

The present invention relates to a method of forming a graphene layer on a non-hexagonal lattice, and a structure obtained by the same.

Graphene is a structure consisting of carbon as a two-dimensional sheet. A graphene monolayer has a thickness of about 0.34 nm, i.e., which is approximately the atomic diameter of a single carbon atom. A graphene layer can exist as a monolayer of a two-dimensional sheet. Alternately, a graphene layer can exist as a stack of a plurality of two-dimensional monolayers of carbon, which do not exceed more than 10 monolayers and is typically limited to less than 5 monolayers. Graphene provides excellent in-plane conductivity. Semiconductor devices employing graphene have been suggested in the art to provide high-density and high-switching-speed semiconductor circuits. Carbon atoms are arranged in a two-dimensional honeycomb crystal lattice in which each carbon-carbon bond has a length of about 0.142 nm.

A graphene layer may be grown by direct epitaxial deposition of carbon atoms on, i.e., addition of carbon atoms onto the surface of, a surface of a single crystalline silicon carbide (SiC) substrate having a hexagonal symmetry such as a (0001) surface of alpha silicon carbide. Alternately, graphene can be grown by heating a hexagonal surface of a single-crystalline silicon carbide material at a temperature greater than 1,100° C. in vacuum or in a non-vacuum ambient. The process of forming graphene by a high temperature anneal is not an additive epitaxy in its strict sense, but is actually a subtractive process in which silicon atoms on a hexagonal surface of a silicon carbide crystal are evaporated during the anneal. The remaining monolayer of carbon forms graphene with an epitaxial relation to the SiC surface.

Alpha silicon carbide has a hexagonal crystal structure, and beta silicon carbide has a cubic crystal structure of zinc blende type. FIG. 1 schematically shows the crystallographic structure of alpha silicon carbide. A (0001) surface is perpendicular to the c-axis and atoms in the (0001) surface are arranged in a pattern having a hexagonal symmetry. The plane in which the (0001) surface is located is referred to as a C plane. A (1102) surface of alpha silicon carbide crystal has a cubic symmetry, and does not have a hexagonal symmetry. The lack of hexagonal symmetry in the (1102) surface of silicon carbide has been considered a detriment to formation of any epitaxial hexagonal structure thereupon.

Silicon carbide substrates having a (0001) surface orientation are not commercially available at a diameter greater than 4 (or 5) inches at the present time. Such unavailability of silicon carbide (SiC) substrates currently makes it impossible to provide a 200 mm substrate or a 300 mm substrate containing a graphene layer. Thus, formation of graphene by epitaxy on a hexagonal surface of a silicon carbide crystal is limited to epitaxial deposition process performed directly on commercially available silicon carbide substrates having a hexagonal symmetry, but cannot be performed on substrates having a diameter of 6 inches or greater.

Prior art methods for forming a graphene layer on a single crystalline silicon carbide (SiC) substrate either by deposition or by reduction of silicon has required a surface having a hexagonal lattice symmetry, which is the same type of lattice symmetry as the in-plane symmetry of the graphene layer. In other words, formation of a graphene layer on a silicon carbide single crystal has required a (0001) surface of alpha silicon carbide having a hexagonal crystal structure.

In order to effect epitaxial growth of graphene or formation of graphene by an anneal, prior art methods require a surface having a hexagonal symmetry so that the graphene to be formed can be aligned to the underlying hexagonal symmetry. Specifically, prior art methods require that a (0001) surface of alpha silicon carbide be provided for either deposition or reduction of silicon in order to form a graphene layer on a surface of silicon carbide.

BRIEF SUMMARY

A graphene layer is formed on a crystallographic surface having a non-hexagonal symmetry. The crystallographic surface can be a surface of a single crystalline semiconductor carbide layer. The non-hexagonal symmetry surface of the single crystalline semiconductor carbide layer is annealed at an elevated temperature in ultra-high vacuum environment to form the graphene layer. During the anneal, the semiconductor atoms (e.g. Si atoms in SiC) on the non-hexagonal surface of the single crystalline semiconductor carbide layer are evaporated selectively to the carbon atoms. As the semiconductor atoms are selectively removed, the carbon concentration on the surface of the semiconductor-carbon alloy layer increases. Despite the non-hexagonal symmetry of the surface of the semiconductor-carbon alloy layer, the remaining carbon atoms can coalesce to form a graphene layer having hexagonal symmetry. Formation of the graphene layer has been experimentally verified by low energy electron diffraction, atomic force microscopy, Raman spectroscopy, and four-point probe sheet resistance measurement. Thus, a graphene layer may be provided on a commercially available semiconductor substrate having a diameter of 200 mm or 300 mm.

According to an aspect of the present invention, a method of forming a graphene layer including at least one graphene monolayer is provided. The method includes forming a graphene layer directly on a crystallographic surface having a non-hexagonal symmetry.

According to another aspect of the present invention, a structure including a graphene layer comprising at least one graphene monolayer is provided. The graphene layer is located directly on a crystallographic surface having a non-hexagonal symmetry.

BRIEF DESCRIPTION OF THE SEVERAL VIEWS OF THE DRAWINGS

FIG. 2 is a vertical cross-sectional view of a first exemplary structure including a single crystalline semiconductor-carbon alloy layer according to a first embodiment of the present invention.

FIG. 3 is a vertical cross-sectional view of the first exemplary structure after formation of a graphene layer according to the first embodiment of the present invention.

FIG. 4 is a vertical cross-sectional view of a second exemplary structure including a semiconductor substrate and a single crystalline semiconductor-carbon alloy layer according to a second embodiment of the present invention.

FIG. 5 is a vertical cross-sectional view of the second exemplary structure after formation of a graphene layer according to the second embodiment of the present invention.

DETAILED DESCRIPTION

Figure 1:
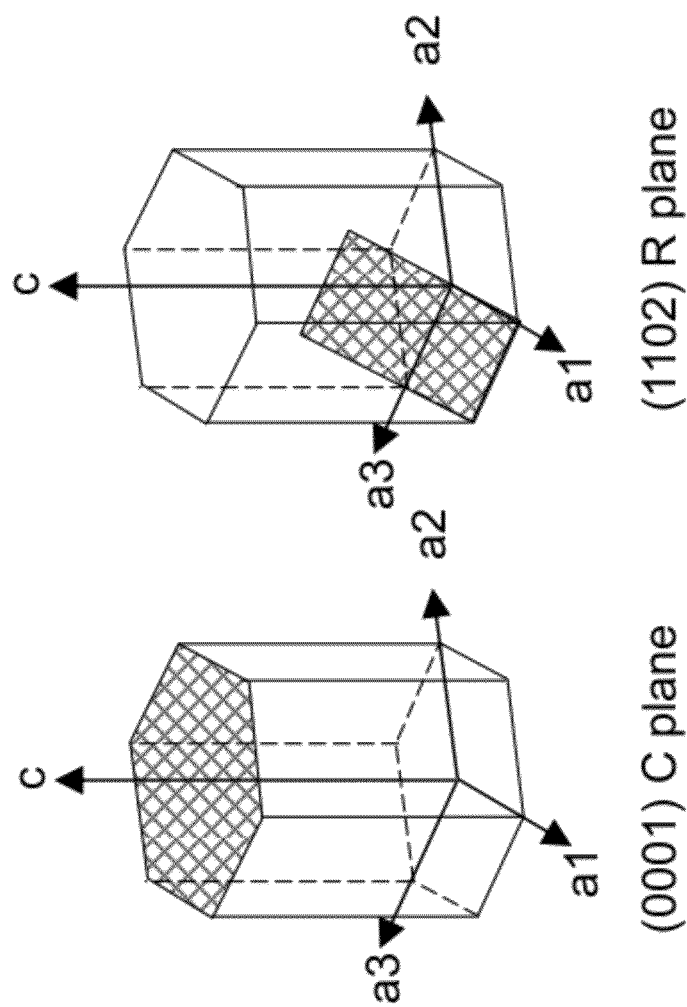
FIG. 1 is a diagram illustrating crystallographic structure of alpha silicon carbide, which has a hexagonal crystal structure, and the orientations of a (0001) surface and a (1102) surface in relation to the hexagonal crystal structure.

As stated above, the present invention relates to a method of forming a graphene layer on a carbon-containing semiconductor layer, and a structure obtained by the same, which are now described in detail with accompanying figures. It is noted that like and corresponding elements are referred to by like reference numerals. The drawings are not in scale. In drawings including a coordinate system, the x-axis is along a horizontal direction within the plane of the drawing, the y-axis is along a direction perpendicular to the plane of the drawing, and the z-axis is along a vertical direction within the plane of the drawing.

As used herein, a "crystalline" structure is a single crystalline structure that has an epitaxial atomic element throughout or a polycrystalline structure that has crystal grains such that atomic alignment is limited within each crystal grain.

Referring to FIG. 2, a first exemplary structure according to a first embodiment of the present invention includes a crystalline semiconductor-carbon alloy layer 20. The crystalline semiconductor-carbon alloy layer 20 can be a single crystalline semiconductor-carbon alloy layer that is single crystalline, i.e., having a unique ordering of atoms, throughout its entirety thereof, or can be a polycrystalline semiconductor-carbon alloy layer such that the crystalline grains of the polycrystalline semiconductor-carbon alloy layer have the same crystallographic orientation on the exposed top surface thereof.

If the crystalline semiconductor-carbon alloy layer 20 is a single crystalline semiconductor-carbon alloy layer, the top surface 21 of the crystalline semiconductor-carbon alloy layer 20 can be a crystallographic surface that has a non-hexagonal symmetry, i.e., a symmetry other than a hexagonal symmetry. Exemplary non-hexagonal symmetries include cubic symmetry, tetragonal symmetry, rhombohedral symmetry, orthorhombic symmetry, monoclinic symmetry, and triclinic symmetry. Thus, the periodic structure of the top surface 21 of the crystalline semiconductor-carbon alloy layer 20 is not invariant under a 60 degree rotation around the z-axis, i.e., an axis perpendicular to the top surface 21 of the crystalline semiconductor-carbon alloy layer 20. The periodic structure of the top surface 21 may, or may not be invariant under rotation around the z-axis by an angle other than 60 degrees. For example, the periodic structure of the top surface 21 may be invariant under rotation around the axis perpendicular to the top surface 21 of the crystalline semiconductor-carbon alloy layer 20 by 90 degrees or 180 degrees. Further, the periodic structure of the top surface 21 may be invariant under translation along at least two independent directions that are parallel to the top surface 21 of the crystalline semiconductor-carbon alloy layer 20.

If the crystalline semiconductor-carbon alloy layer 20 is a single crystalline semiconductor-carbon alloy layer, the crystalline semiconductor-carbon alloy layer 20 is a single crystalline layer in which all atoms are epitaxially aligned to all other atoms of the crystalline semiconductor-carbon alloy layer 20 except for naturally present imperfections in the crystal lattice structure such as dislocations and/or point defects. Point defects can be substitutional defects or interstitial defects as known in the art.

If the crystalline semiconductor-carbon alloy layer 20 is a polycrystalline semiconductor-carbon alloy layer, such that the crystalline grains of the polycrystalline semiconductor-carbon alloy layer can have the same crystallographic orientation on the top surface thereof. Epitaxial alignment is limited only within each crystalline grains because the grain boundaries disrupt the epitaxial alignments. The top surface 21 of the crystalline semiconductor-carbon alloy layer 20 includes a plurality of crystallographic surfaces each having a non-hexagonal symmetry, i.e., a symmetry other than a hexagonal symmetry.

In a first illustrative example, the crystalline semiconductor-carbon alloy layer 20 can be a layer of a silicon-carbon alloy. In this example, the crystalline semiconductor-carbon alloy layer 20 can be single crystalline or polycrystalline. Carbon has an atomic concentration from 20% to 75% in the silicon-carbon alloy, and preferably has an atomic composition from 45% to 55% in the silicon-carbon alloy.

In a second illustrative example, the crystalline semiconductor-carbon alloy layer 20 can be a layer of a silicon-germanium-carbon alloy. In this example, the crystalline semiconductor-carbon alloy layer 20 can be single crystalline or polycrystalline. Carbon has an atomic concentration from 20% to 75% in the silicon-germanium-carbon alloy, and preferably has an atomic composition from 45% to 55% in the silicon-germanium-carbon alloy.

In a third illustrative example, the crystalline semiconductor-carbon alloy layer 20 can be a layer of a germanium-carbon alloy. In this example, the crystalline semiconductor-carbon alloy layer 20 can be single crystalline or polycrystalline. Carbon has an atomic concentration from 20% to 75% in the germanium-carbon alloy, and preferably has an atomic composition from 45% to 55% in the germanium-carbon alloy.

In a fourth illustrative example, the crystalline semiconductor-carbon alloy layer 20 can be a superlattice including multiple repetitions of a first material layer and a second material layer. In this example, the crystalline semiconductor-carbon alloy layer 20 can be single crystalline or polycrystalline. At least one of the first material layer and a second material layer includes carbon and at least one of the first material layer and a second material layer includes at least one of silicon and germanium. The first material layer may include silicon, germanium, or an alloy of silicon and the second material layer may include carbon or a carbon alloy. An exemplary combination of the first material layer and the second material layer is a silicon layer and a carbon layer. Another exemplary combination of the first material layer is a silicon boride layer and a carbon layer.

In some cases, the top surface 21 of the crystalline semiconductor-carbon alloy layer 20 can have a rectangular symmetry. The crystalline semiconductor-carbon alloy layer 20 can be a single crystalline semiconductor carbide layer such as a single crystalline silicon carbide layer.

In one case, the top surface 21 of the crystalline semiconductor-carbon alloy layer 20 can be a non-hexagonal surface of a single crystalline silicon carbide layer in alpha phase, which is a hexagonal crystal structure phase of silicon carbide. In this case, all crystallographic surfaces other than (0001) surfaces of the single crystalline silicon carbide layer in alpha phase are surfaces having a non-hexagonal symmetry.

In another case, the top surface 21 of the crystalline semiconductor-carbon alloy layer 20 can be a non-hexagonal surface of a single crystalline silicon carbide layer in beta phase, which is a cubic crystal structure of zinc blende type. In this case, all crystallographic surfaces other than (111) surfaces of the single crystalline silicon carbide layer in beta phase are surfaces having a non-hexagonal symmetry. For example, the top surface 21 of the crystalline semiconductor-carbon alloy layer 20 can be a (100) surface of the single crystalline silicon carbide layer in beta phase.

In yet another case, the top surface 21 of the crystalline semiconductor-carbon alloy layer 20 can be a collection of non-hexagonal surfaces of a polycrystalline silicon carbide layer in alpha phase, which is a hexagonal crystal structure phase of silicon carbide. In this case, all crystallographic surfaces other than (0001) surfaces of the single crystalline silicon carbide layer in alpha phase are surfaces having a non-hexagonal symmetry.

In still another case, the top surface 21 of the crystalline semiconductor-carbon alloy layer 20 can be a collection of non-hexagonal surfaces of a polycrystalline silicon carbide layer in beta phase, which is a cubic crystal structure of zinc blende type. In this case, all crystallographic surfaces other than (111) surfaces of the polycrystalline silicon carbide layer in beta phase are surfaces having a non-hexagonal symmetry. For example, the top surface 21 of the crystalline semiconductor-carbon alloy layer 20 can be a set consisting of (100) surface of the polycrystalline silicon carbide layer in beta phase.

Referring to FIG. 3, a graphene layer 30 is formed directly on the top surface 21 of the crystalline semiconductor-carbon alloy layer 20. The graphene layer 30 includes at least one graphene monolayer. The graphene layer 30 can consist of a single monolayer of graphene, or can include several monolayers of graphene that are loosely bonded between adjacent monolayers only by Van der Waals force. The graphene layer 30 is formed directly on the top surface 21 of the crystalline semiconductor-carbon alloy layer 20, which is a crystallographic surface having a non-hexagonal symmetry. For example, in case the top surface 21 of the crystalline semiconductor-carbon alloy layer 20 is a (100) surface of a single crystalline silicon carbide layer in beta phase, the graphene layer 30 contacts a (100) surface of the single crystalline silicon carbide layer in the beta phase.

The graphene layer 30 can be formed by an anneal that converts a surface layer of the crystalline semiconductor-carbon alloy layer 20 into the graphene layer. The anneal can be performed in vacuum at an elevated temperature between 800° C. and 2,000° C., and typically between 1,000° C. and 1,400° C. The graphene layer 30 can be formed despite the lack of hexagonal symmetry in the top surface 21 of the crystalline semiconductor-carbon alloy layer 20. Formation of the graphene layer 30, which has a hexagonal symmetry within each monolayer therein, on a crystallographic surface having a non-hexagonal symmetry is not obvious because any symmetry in a surface layer generally follows the symmetry of an underlying layer. However, research leading to the instant invention has revealed that the graphene layer 30 having a hexagonal symmetry can be formed on surfaces having a non-hexagonal symmetry.

Referring to FIG. 4, a second exemplary structure according to a second embodiment of the present invention includes a semiconductor substrate 10 and a crystalline semiconductor-carbon alloy layer 20. The crystalline semiconductor-carbon alloy layer 20 is formed by depositing a semiconductor-carbon alloy material directly on the semiconductor substrate 10 by epitaxy. Thus, the atoms in the crystalline semiconductor-carbon alloy layer 20 are epitaxially aligned to the atoms of the semiconductor substrate 10. The epitaxy of the semiconductor-carbon alloy material can be deposited on the semiconductor substrate 10, for example, by chemical vapor deposition (CVD), molecular beam epitaxy (MBE), and/or atomic layer deposition (ALD).

The composition and the crystallographic orientations of the semiconductor substrate 10 are selected so that the top surface of the crystalline semiconductor-carbon alloy layer 20 has a crystallographic surface having a non-hexagonal symmetry as in the first exemplary structure. The composition and crystallographic orientations of the crystalline semiconductor-carbon alloy layer 20 can be the same as in the first exemplary structure.

For example, the top surface 21 of the crystalline semiconductor-carbon alloy layer 20 can have a rectangular symmetry. The crystalline semiconductor-carbon alloy layer 20 can be a single crystalline semiconductor carbide layer such as a single crystalline silicon carbide layer as discussed above. Alternately, the crystalline semiconductor-carbon alloy layer 20 can be a polycrystalline semiconductor carbide layer such as a polycrystalline silicon carbide layer as discussed above.

In one case, the top surface 21 of the crystalline semiconductor-carbon alloy layer 20 can be a non-hexagonal surface of a single crystalline silicon carbide layer in alpha phase, which is a hexagonal crystal structure phase of silicon carbide. In this case, all crystallographic surfaces other than (0001) surfaces of the single crystalline silicon carbide layer in alpha phase are surfaces having a non-hexagonal symmetry.

In another case, the top surface 21 of the crystalline semiconductor-carbon alloy layer 20 can be a non-hexagonal surface of a single crystalline silicon carbide layer in beta phase, which is a cubic crystal structure of zinc blende type. In this case, all crystallographic surfaces other than (111) surfaces of the single crystalline silicon carbide layer in beta phase are surfaces having a non-hexagonal symmetry. If the semiconductor substrate 10 is a single crystal silicon layer, the top surface 21 of the crystalline semiconductor-carbon alloy layer 20 can be a (100) surface of the single crystalline silicon carbide layer in beta phase, and the single crystalline silicon carbide layer can be formed directly on a (100) surface of the single crystalline silicon layer.

In yet another case, the top surface 21 of the crystalline semiconductor-carbon alloy layer 20 can be a collection of non-hexagonal surfaces of a polycrystalline silicon carbide layer in alpha phase, which is a hexagonal crystal structure phase of silicon carbide. In this case, all crystallographic surfaces other than (0001) surfaces of the polycrystalline silicon carbide layer in alpha phase are surfaces having a non-hexagonal symmetry.

In still another case, the top surface 21 of the crystalline semiconductor-carbon alloy layer 20 can be a collection of non-hexagonal surfaces of a polycrystalline silicon carbide layer in beta phase, which is a cubic crystal structure of zinc blende type. In this case, all crystallographic surfaces other than (111) surfaces of the polycrystalline silicon carbide layer in beta phase are surfaces having a non-hexagonal symmetry. If the semiconductor substrate 10 is a single crystalline silicon layer, the top surface 21 of the crystalline semiconductor-carbon alloy layer 20 can be a (100) surface of the polycrystalline silicon carbide layer in beta phase, and the polycrystalline silicon carbide layer can be formed directly on a (100) surface of the single crystalline silicon layer.

Referring to FIG. 5, a graphene layer 30 can be formed directly on the top surface 21 of the crystalline semiconductor-carbon alloy layer 20, which is a crystallographic surface having a non-hexagonal symmetry. The graphene layer 30 is structurally the same as in the first embodiment, and can be formed by employing the same method. Because of the presence of the semiconductor substrate 10, however, the temperature range at which the anneal can be performed to form the graphene layer 30 is limited below the melting temperature of the semiconductor substrate 10.

In an experiment, a sample of the second exemplary structure was experimentally fabricated and tested. In this experiment, a stack of the single crystalline beta phase silicon carbide layer and the (100) silicon layer was placed in a vacuum environment. The beta phase silicon carbide layer had an exposed (100) surface, which was parallel to the top surface of the (100) silicon substrate. The exposed surface of the single crystalline beta phase silicon carbide layer was degassed for about 28 minutes at about 810° C. in order to evaporate impurity atoms from the surface of the single crystalline beta phase silicon carbide layer. The background pressure of the vacuum environment was maintained below $1.0 \times 10^{-7}$ Torr during the degassing. 20% disilane ($Si_2H_6$) gas with He balance gas was introduced into the vacuum environment for about 10 minutes while maintaining a total pressure of about $3.0 \times 10^{-7}$ and the temperature about 810° C. The disilane gas is a reducing agent intended to remove ay oxidized material from the surface of the single crystalline beta phase silicon carbide layer.

Once the disilane gas was turned off, the system was pumped down to a base pressure below $1.0 \times 10^{-8}$ Torr, and the sample was annealed at a temperature of 1,300° C. This anneal graphitized the top surface of the single crystalline beta phase silicon carbide layer, and formed a graphene layer 30 having a hexagonal symmetry although the top surface of the single crystalline beta phase silicon carbide layer was a (100) surface having a rectangular symmetry.

Figure 7:
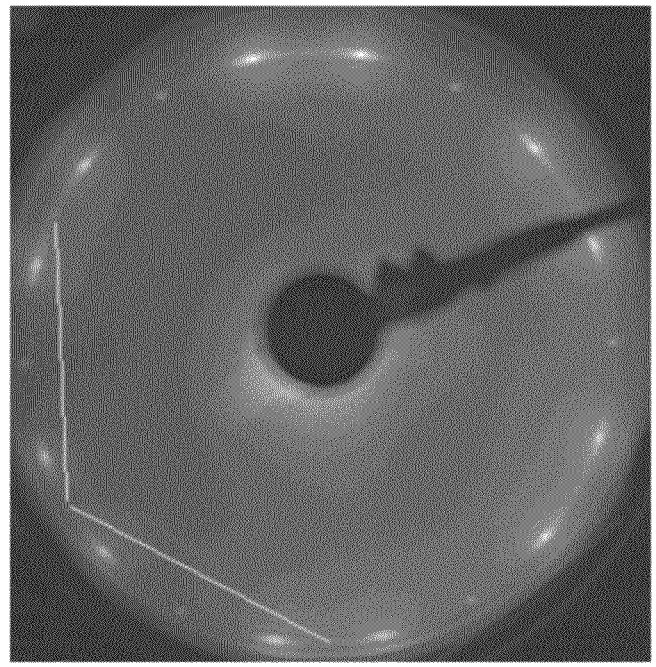
FIG. 7 is a low energy electron diffraction (LEED) image of a graphene layer on a (0001) surface of a silicon carbide layer having a hexagonal crystal symmetry.
Figure 6:
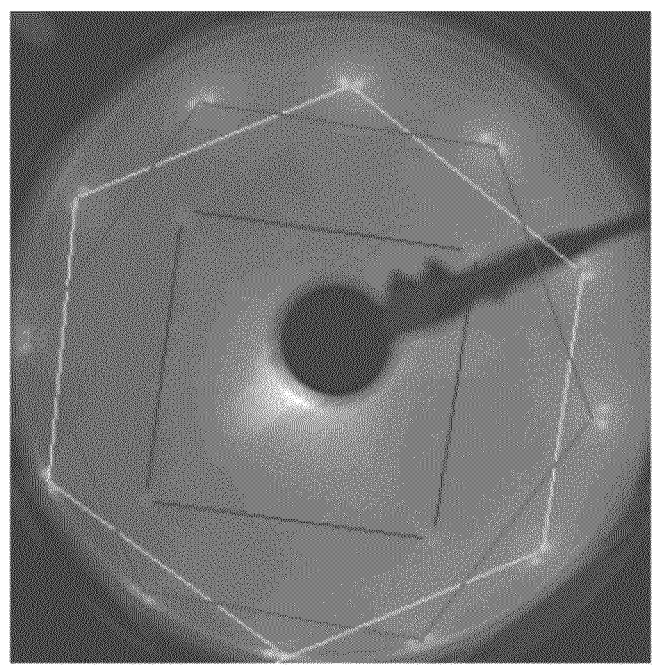
FIG. 6 is a low energy electron diffraction (LEED) image of a graphene layer on a (100) surface of a silicon carbide layer having a cubic crystal symmetry.

Low energy electron diffraction (LEED) data showed that a graphene layer is present on the surface of this sample. FIG. 6 shows a LEED image of the graphene layer 30 in this sample. The graphene layer 30 is formed directly on the (100) surface of the single crystalline beta phase silicon carbide layer, which is a silicon carbide layer having a cubic crystal symmetry. Comparison of FIG. 6 with FIG. 7, which is a LEED image of a graphene layer on a (0001) surface of a silicon carbide layer having a hexagonal crystal symmetry, shows that the same type of crystal symmetry is observed in FIG. 6 as in FIG. 7. This points to the presence of the graphene layer 30 on the (100) surface of the single crystalline beta phase silicon carbide layer in the sample.

Figure 8A:
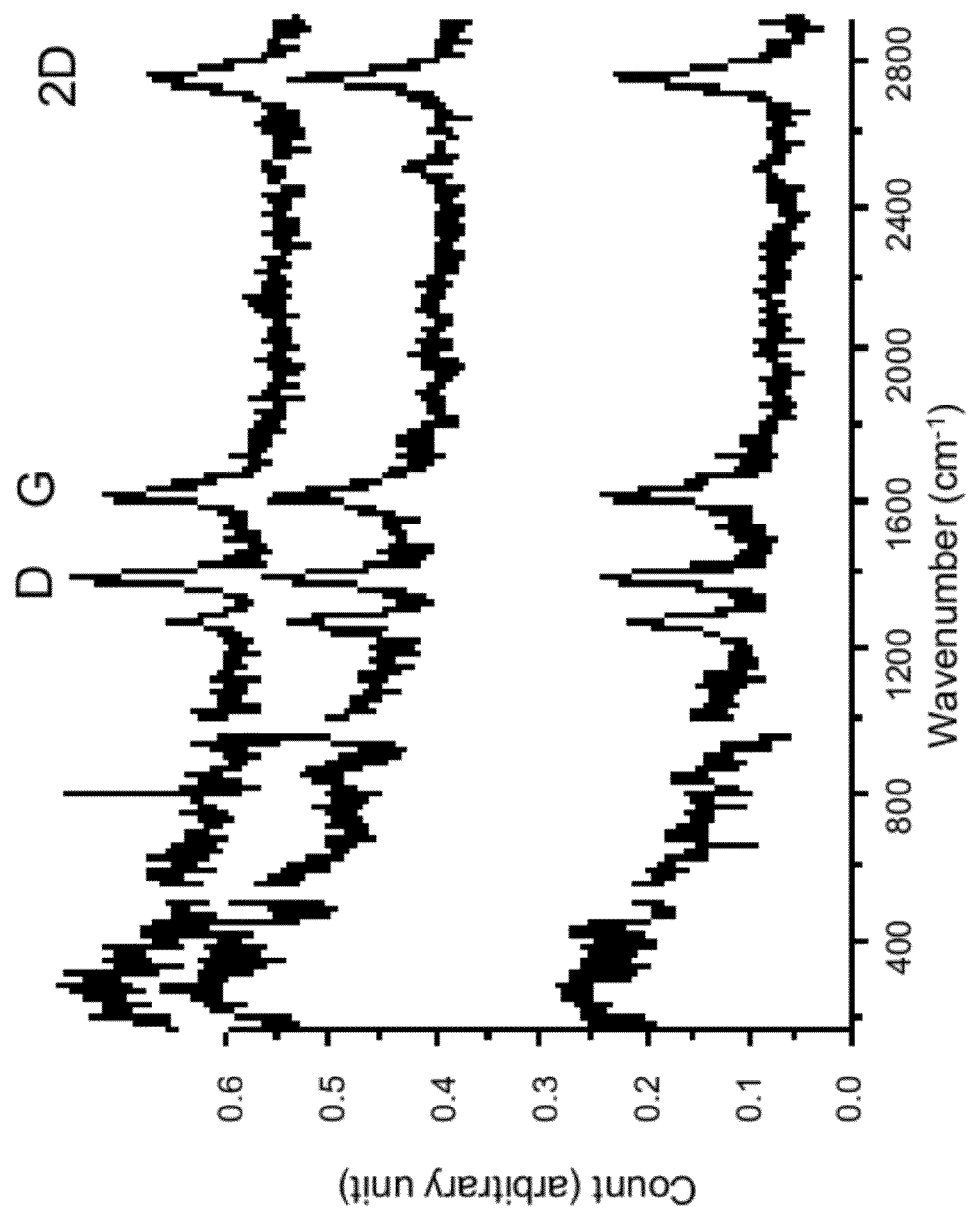
FIGS. 8A-8C are Raman spectra of a graphene layer on a (100) surface of a silicon carbide layer having a cubic crystal symmetry. Each of the twelve Raman spectra corresponds to different sampling locations.
Figure 8B:
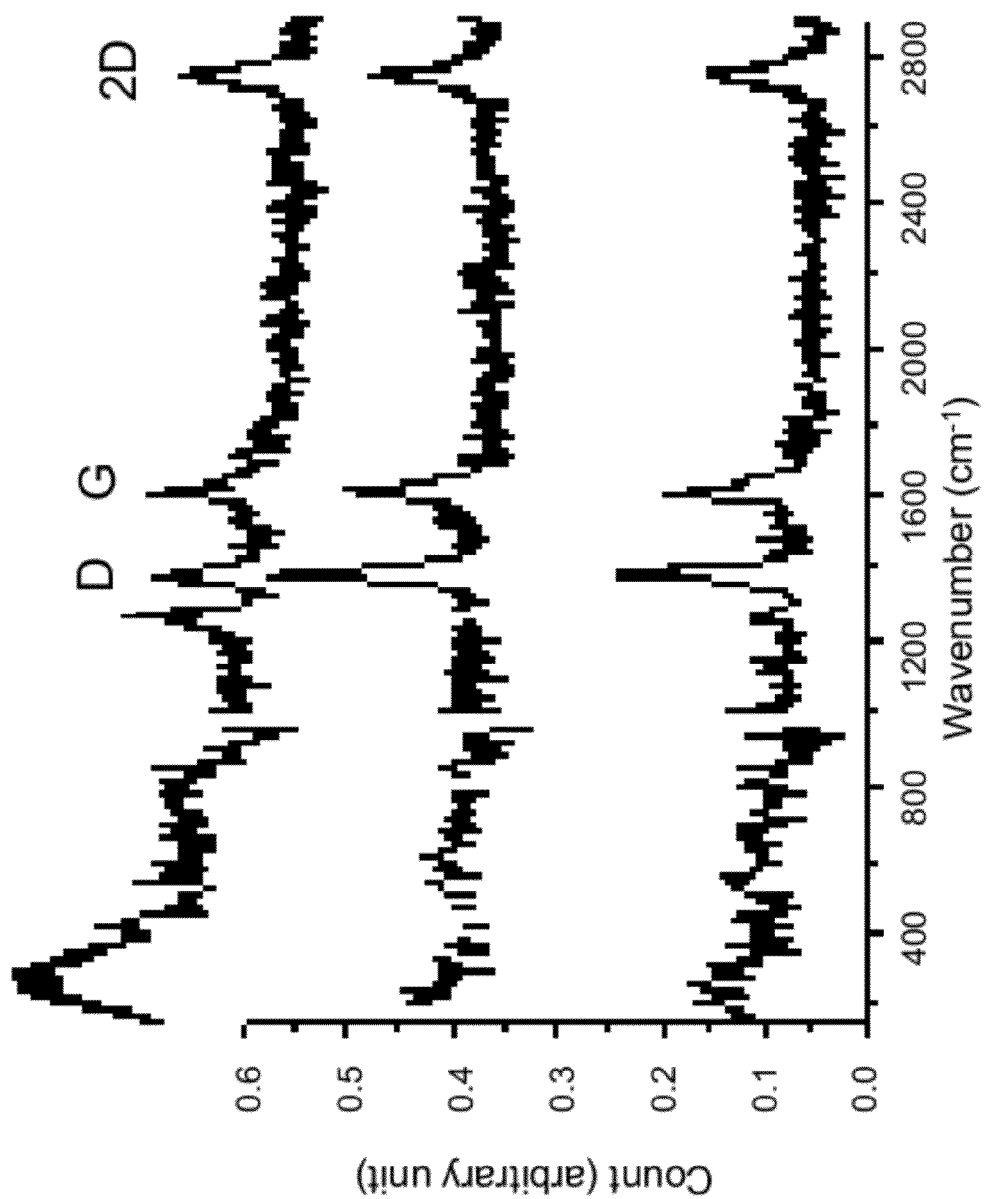
Figure 8C:
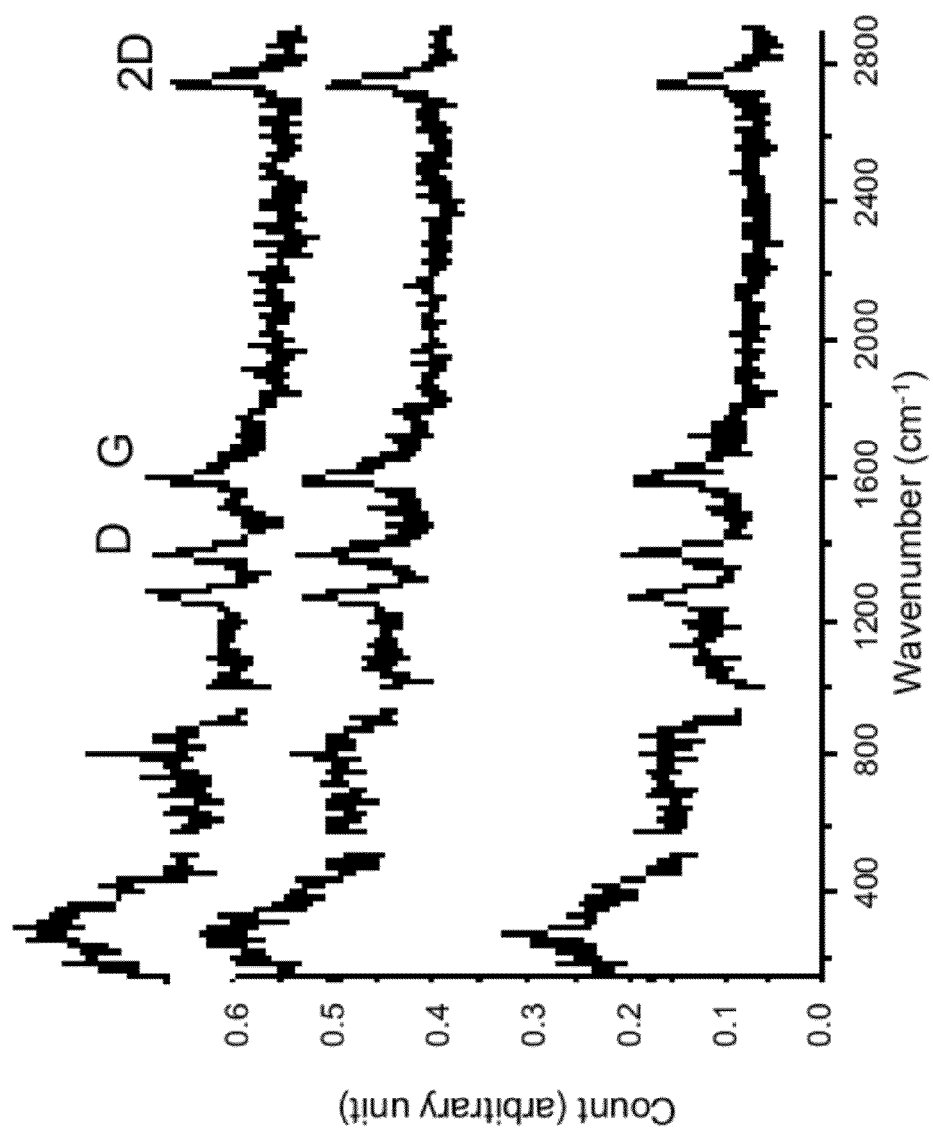

Raman spectra data also shows the presence of the graphene layer on the surface of the sample. FIGS. 8A-8C are Raman spectra of a graphene layer on a (100) surface of a silicon carbide layer having a cubic crystal symmetry. Each of the twelve Raman spectra corresponds to different sampling locations. Each Raman spectrum in the same drawing is vertically shifted relative to other Raman spectra by an arbitrary amount in order to clearly show the variations in intensity as a function of wavenumber.

Graphene is known to have three prominent Raman peaks, which include a G peak around $1580\ cm^{-1}$, a D peak around $1350\ cm^{-1}$, and a 2D peak around $2700\ cm^{-1}$. The G peak is due to double degeneracy at the center of the Brillouin zone, the D peak is due to defect mediated zone-edge phonons near the K-point of the Brillouin zone, and the 2D peak is due to second order double resonant Raman scattering from a zone boundary. All three peaks are visible in each Raman spectra, confirming the presence of the graphene layer 30 on the (100) surface of the single crystalline beta phase silicon carbide layer.

Figure 9B:
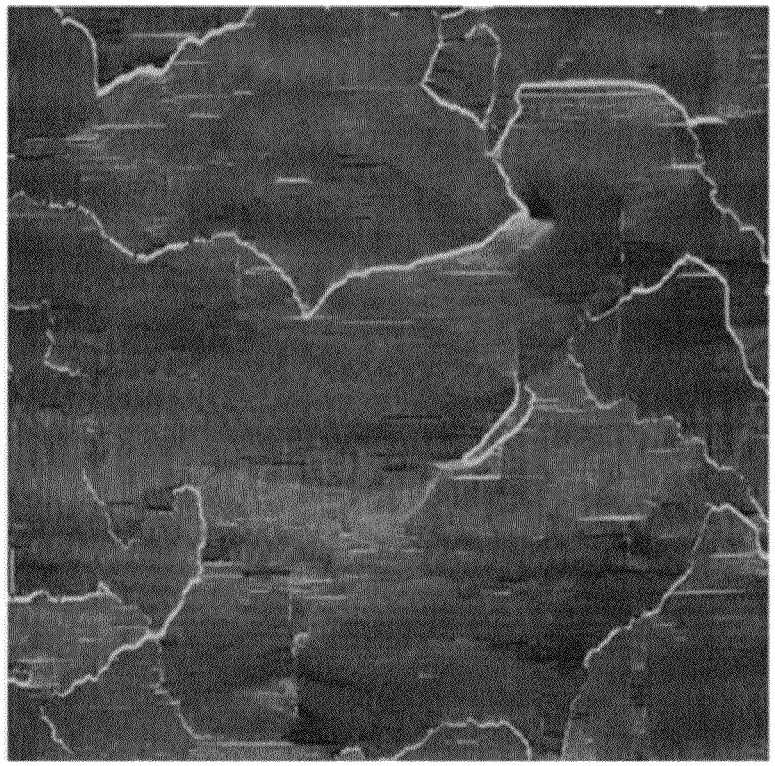
FIG. 9B is an image from a phase scan of the (100) surface of the silicon carbide layer grown on Si (100) and having a cubic crystal symmetry over the 20 microns×20 microns area of FIG. 9A before formation of a graphene layer employing the atomic force microscopy (AFM) probe.
Figure 9A:
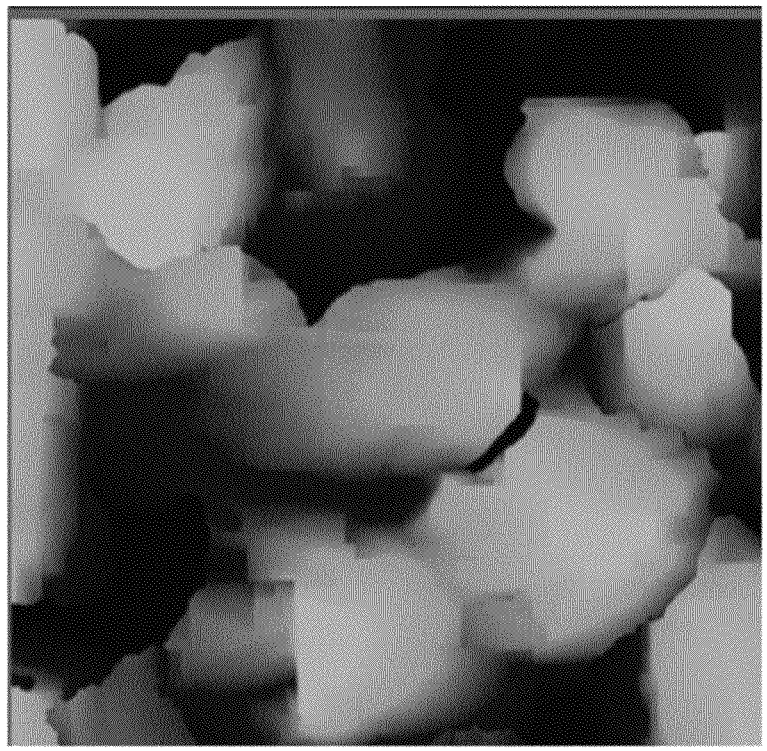
FIG. 9A is an image from a height scan of a (100) surface of a silicon carbide layer grown on Si (100) and having a cubic crystal symmetry over an area of 20 microns×20 microns before formation of a graphene layer employing an atomic force microscopy (AFM) probe.

FIG. 9A is an image from a height scan of a (100) surface of the single crystalline beta phase silicon carbide layer of the sample over an area of 20 microns×20 microns as generated by an atomic force microscopy (AFM) probe. FIG. 9B is a corresponding phase scan of the (100) surface of the silicon carbide layer of the sample. Thus, the images in FIGS. 9A and 9B were generated before formation of the graphene layer 30. The images of FIGS. 9A and 9B were generated concurrently by the same scan of the AFM probe, but the data was subsequently processed to generate the height scan of FIG. 9A that shows contours of the (100) surface of the single crystalline beta phase silicon carbide layer and to generate the phase scan of FIG. 9B that shows changes in the height of the (100) surface, i.e., the presence of ledges in the (100) surface after formation of the graphene layer 30

Figure 10B:
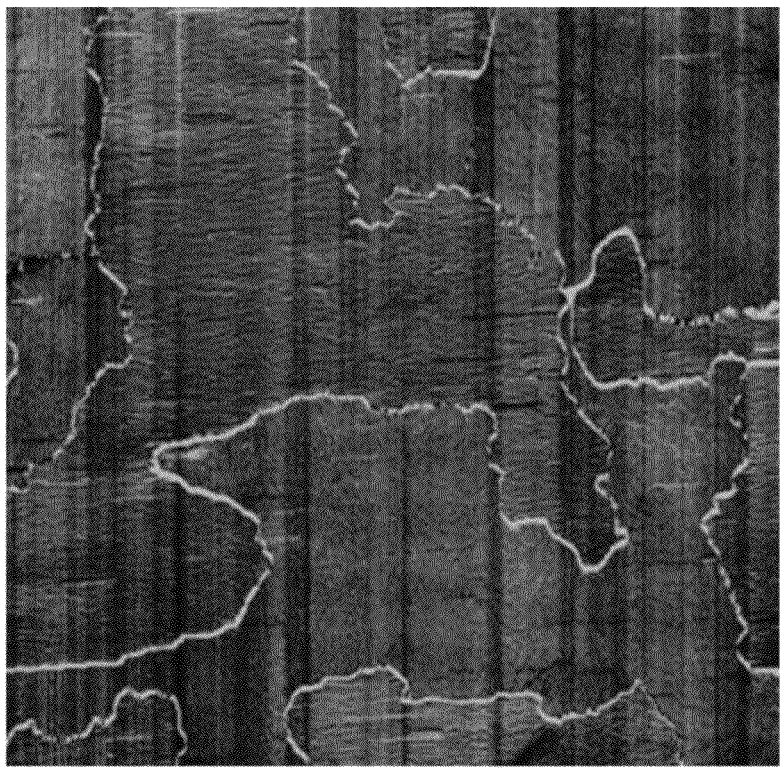
FIG. 10B is an image from a phase scan of the graphene layer on the (100) surface of the silicon carbide layer grown on a (100) surface of a single crystalline silicon layer having a cubic crystal symmetry over the 20 microns×20 microns area of FIG. 9A employing the atomic force microscopy (AFM) probe.
Figure 10A:
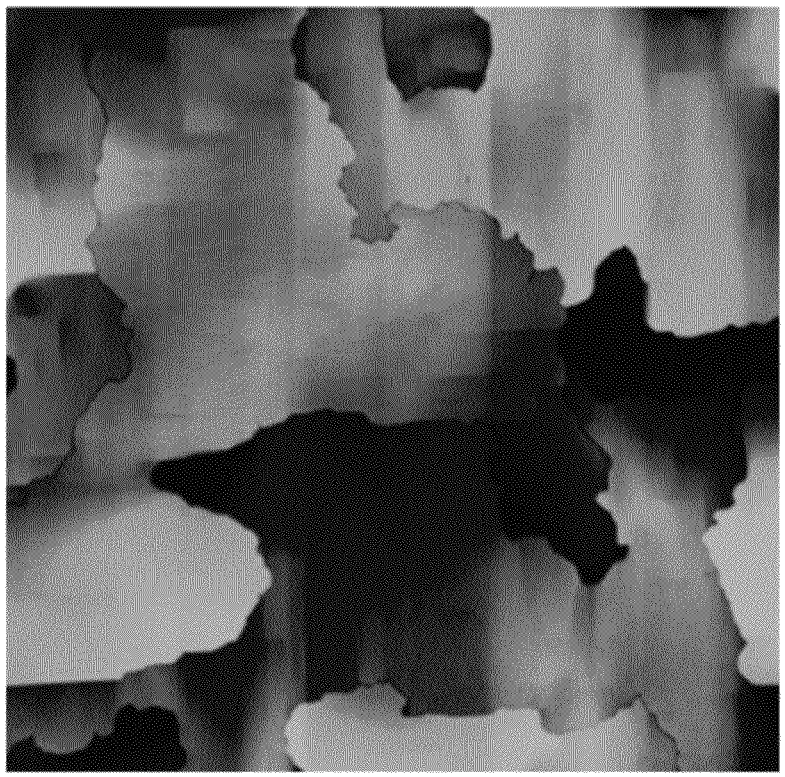
FIG. 10A is an image from a height scan of a graphene layer on a (100) surface of a silicon carbide layer grown on a (100) surface of a single crystalline silicon layer having a cubic crystal symmetry over an area of 20 microns×20 microns employing an atomic force microscopy (AFM) probe.

FIG. 10A is an image from a height scan of the graphene layer 30 formed on the (100) surface of the single crystalline beta phase silicon carbide layer of the sample over an area of 20 microns×20 microns as generated by the atomic force microscopy (AFM) probe. FIG. 10B is a corresponding phase scan of the graphene layer 30 of the sample. Thus, the images in FIGS. 10A and 10B were generated after formation of the graphene layer 30, i.e., after graphitization. The images of FIGS. 10A and 10B were concurrently generated by the same scan of the AFM probe, but the data was subsequently processed to generate the height scan of FIG. 10A that shows contours of the graphene layer 30 and to generate the phase scan of FIG. 10B that shows the presence of ledges in the graphene layer 30.

Comparison of FIGS. 9A and 10A and comparison of FIGS. 9B and 10B show that there is not any substantial increase in surface roughness due to formation of the graphene layer 30 in the sample. Thus, the graphene layer 30 is not formed through a three-dimensional growth or agglomeration, but the graphene layer 30 is formed as a planar layer on the entirety of the surface of the sample. The absence of pits on the surface of the SiC after graphene formation, which characterize the graphene formation on the Si-face of hexagonal SiC under similar conditions, is a remarkable result.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a graphene layer including at least one graphene monolayer, said method comprising forming a graphene layer by evaporating semiconductor atoms selective to carbon atoms from a crystallographic semiconductor surface having a non-hexagonal symmetry that is different from a symmetry of a (111) plane of any cubic crystal structure.

2. The method of claim 1, wherein said crystallographic semiconductor surface has a rectangular symmetry.

3. The method of claim 1, wherein said crystallographic semiconductor surface is a surface of a crystalline semiconductor carbide layer.

4. The method of claim 3, wherein said crystalline semiconductor carbide layer is a crystalline silicon carbide layer.

5. The method of claim 4, wherein said crystalline semiconductor carbide layer is a polycrystalline silicon carbide layer having a beta phase and a plurality of (100) crystallographic semiconductor surfaces.

6. The method of claim 4, wherein said crystalline semiconductor carbide layer is a single crystalline silicon carbide layer having a beta phase and a (100) crystallographic semiconductor surface.

7. The method of claim 3, wherein said crystalline semiconductor carbide layer is formed directly on a single crystalline semiconductor layer prior to forming said graphene layer.

8. The method of claim 7, wherein said crystalline semiconductor carbide layer is a single crystalline silicon carbide layer in beta phase having zinc blende structure, and said single crystalline semiconductor layer is a single crystalline silicon layer.

9. The method of claim 8, wherein said graphene layer is formed directly on a (100) surface of said single crystalline silicon carbide layer in said beta phase.

10. The method of claim 9, wherein said single crystalline silicon carbide layer is formed directly on a (100) surface of said single crystalline silicon layer.

11. The method of claim 3, wherein said graphene layer is formed by an anneal that converts a surface layer of said crystalline semiconductor carbide layer into said graphene layer.

12. The method of claim 1, wherein said non-hexagonal symmetry is selected from cubic symmetry, rectangular symmetry, and tetragonal symmetry.

13. The method of claim 1, wherein said non-hexagonal symmetry is selected from cubic symmetry and rectangular symmetry.

14. The method of claim 1, wherein said non-hexagonal symmetry is cubic symmetry.

* * * * *